(12) United States Patent
Tai (10) Patent No.: US 8,237,917 B2
(45) Date of Patent: Aug. 7, 2012

(54) EXPOSURE APPARATUS AND DEVICE MANUFACTURING METHOD

(75) Inventor: Masaki Tai, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 529 days.

(21) Appl. No.: 12/483,663

(22) Filed: Jun. 12, 2009

(65) Prior Publication Data

US 2009/0310110 A1 Dec. 17, 2009

(30) Foreign Application Priority Data

Jun. 16, 2008 (JP) ................................. 2008-156997

(51) Int. Cl.
*G03B 27/54* (2006.01)
*G03B 27/42* (2006.01)
*G03B 27/58* (2006.01)
*G03B 27/32* (2006.01)
*G03B 27/68* (2006.01)
*G03B 27/52* (2006.01)

(52) U.S. Cl. ................. 355/71; 355/52; 355/53; 355/55; 355/67; 355/72; 355/77

(58) Field of Classification Search ................. 355/52, 355/53, 55, 67–71, 72, 77; 356/432, 433, 356/434, 213
See application file for complete search history.

(56) References Cited

U.S. PATENT DOCUMENTS

| 5,160,962 A | * | 11/1992 | Miura et al. | 355/53 |
| 5,400,386 A | | 3/1995 | Amemiya et al. | 378/205 |
| 5,659,383 A | * | 8/1997 | Ozawa | 355/53 |
| 5,861,944 A | * | 1/1999 | Nishi | 355/68 |
| 6,040,894 A | * | 3/2000 | Takahashi | 355/53 |
| 6,333,777 B1 | * | 12/2001 | Sato | 355/53 |
| 2001/0028448 A1 | * | 10/2001 | Mori | 355/55 |
| 2002/0190228 A1 | * | 12/2002 | Suzuki et al. | 250/548 |
| 2003/0025890 A1 | * | 2/2003 | Nishinaga | 355/53 |

FOREIGN PATENT DOCUMENTS

JP 4-88621 3/1992

* cited by examiner

*Primary Examiner* — Peter B Kim
*Assistant Examiner* — Christina Riddle
(74) *Attorney, Agent, or Firm* — Fitzpatrick, Cella, Harper & Scinto (57) ABSTRACT

An exposure apparatus projects a pattern of an original illuminated by an illumination system onto a substrate, by a projection optical system, to expose the substrate. A light-shielding member defines a position at which light falls on an image plane of the projection optical system. An illuminance sensor measures an illuminance on the image plane, and a controller detects a position, on the image plane, of the illuminance sensor. The controller detects the position of the illuminance sensor based on a peak of the output from the illuminance sensor and a position of the light shielding member obtained while moving the light-shielding member, so that a position at which light falls on the image plane moves along the image plane.

6 Claims, 4 Drawing Sheets

EXPOSURE APPARATUS AND DEVICE MANUFACTURING METHOD

This application claims the benefit of Japanese Patent Application No. 2008-156997, filed Jun. 16, 2008, which is hereby incorporated by reference herein in its entirety.

BACKGROUND OF THE INVENTION

1. Field of the Invention

The present invention relates to an exposure apparatus and a method of manufacturing a device using the same.

2. Description of the Related Art

An exposure apparatus projects the pattern of an original (also called a reticle or mask) onto a substrate by a projection optical system to expose the substrate, using an excimer laser or a mercury lamp as an exposure light source. The substrate is coated with a photoresist, on which a latent image is formed by exposure.

The exposure process of exposing a substrate by the exposure apparatus requires precise exposure dose control on the substrate. A measurement device for measuring the illuminance of the exposure light that falls on the image plane (the plane on which a substrate is positioned) of the projection optical system is mounted on the substrate stage of the exposure apparatus.

Since the sensitivity of the measurement device is not constant under all circumstances involved, the measurement device must be calibrated in accordance with an appropriate schedule. In addition, since the device manufacturing line generally uses a plurality of exposure apparatuses, these apparatuses must have the same illuminance so that they have the same throughput. To meet these needs, a common calibration illuminance sensor can be used to calibrate the sensitivities of the measurement device in the plurality of exposure apparatuses.

In the sensitivity calibration using a calibration illuminance sensor, the illuminance sensor is positioned in the exposure region on the image plane of the projection optical system, and measures the illuminance. Also, the calibration target measurement device mounted on the substrate stage is positioned in the exposure region, and measures the illuminance. The sensitivity of the measurement device is calibrated based on the relationship between the outputs from the calibration illuminance sensor and the measurement device. Note that the sensitivity calibration of the measurement device typically means determining a calibration value, by which the output from the measurement device is multiplied, in order to correct the output from the measurement device.

An illuminance distribution formed in the exposure region typically has a trapezoidal shape. In other words, an illuminance distribution formed in the exposure region typically has a main region in which the illuminance is uniform, and peripheral regions located on the two sides of the main region. In the peripheral region, the illuminance lowers in accordance with the distance from the main region. Note that both the calibration illuminance sensor and the calibration target measurement device must be located in the main region upon sensitivity calibration. If one of the calibration illuminance sensor and the calibration target measurement device falls in either peripheral region, their outputs are naturally different from each other due to the difference in illuminance between the main and peripheral regions. This makes it impossible to correctly calibrate the sensitivity of the measurement device.

As the NA (Numerical Aperture) of the projection optical system increases, the width of the main region in which the illuminance is uniform narrows. Thus, it is becoming increasingly difficult to set the calibration illuminance sensor in the main region.

In general, the position of the substrate stage is controlled with a very high accuracy in order to precisely position the substrate. It is, therefore, easy to position the measurement device, mounted on the substrate stage, in the exposure region. It is also easy to position the calibration illuminance sensor in the main region, in which the illuminance is uniform, of the exposure region, as long as this sensor is mounted on the substrate stage as needed.

Unfortunately, when an improvement in the throughput is of prime importance, it is unfavorable to provide a holding unit, for holding the calibration illuminance sensor in the sensitivity calibration, to the substrate stage. This is because such a holding unit complicates the substrate stage, leading to an increase in its weight.

It is, therefore, desirable to adopt a scheme of setting the calibration illuminance sensor on the image plane of the projection optical system every time the sensitivity of the measurement device is calibrated. In this scheme, an arm can be attached to a driving mechanism that is independent of the substrate stage, on which the calibration illuminance sensor can be mounted. In this case, the calibration illuminance sensor can be positioned on the image plane by driving the arm by the driving mechanism.

The problem with this scheme, however, is that an error that arises upon attaching the arm to the driving mechanism or attaching the illuminance sensor on the arm degrades the positioning accuracy of the illuminance sensor. Furthermore, the attachment error directly turns into a positioning error, because a driving mechanism as described above generally does not cooperate with a position sensor, indispensable to precisely position the illuminance sensor as the positioning target object. Also, additionally providing a high-accuracy position sensor to the exposure apparatus increases the complexity of the exposure apparatus and the manufacturing cost.

SUMMARY OF THE INVENTION

The present invention provides a technique for detecting the position of an illuminance sensor with high accuracy, while suppressing increases in the cost and the complexity of the arrangement of an exposure apparatus.

One of the aspects of the present invention provides an exposure apparatus that projects a pattern of an original illuminated by an illumination system onto a substrate by a projection optical system to expose the substrate, the apparatus comprising a light-shielding member configured to define a position at which light falls on an image plane of the projection optical system, an illuminance sensor configured to measure an illuminance on the image plane, and a controller configured to detect a position, on the image plane, of the illuminance sensor, wherein the controller is configured to detect the position of the illuminance sensor based on the output from the illuminance sensor obtained while moving the light-shielding member, so that a position at which light falls on the image plane moves along the image plane.

Further features of the present invention will become apparent from the following description of exemplary embodiments, with reference to the attached drawings.

DESCRIPTION OF THE EMBODIMENTS

Preferred embodiments of the present invention will be described below with reference to the accompanying drawings.

First Embodiment

Figure 1:
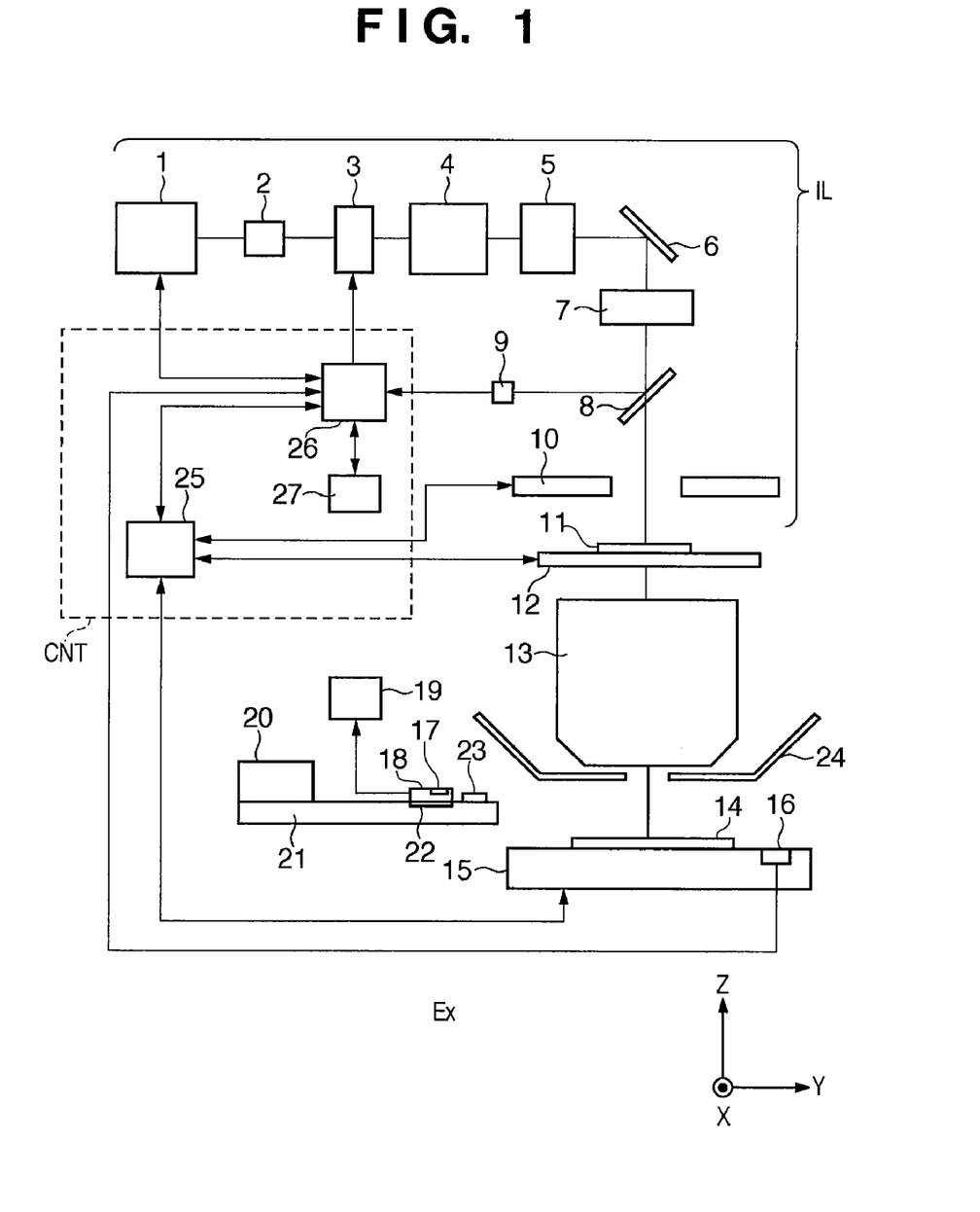
FIG. 1 is a view showing the schematic arrangement of an exposure apparatus of the step and scan scheme according to a preferred embodiment of the present invention.

FIG. 1 is a view showing the schematic arrangement of an exposure apparatus of the step and scan scheme according to a preferred embodiment of the present invention. The step and scan scheme means a scheme of projecting the pattern of an original 11 onto a substrate (e.g., a wafer) 14 by a projection optical system 13, while synchronously scanning them, thereby exposing the substrate 14. Note that the original 11 is scanned so that its pattern region passes through the illumination region illuminated by an illumination system IL. The illumination region is defined by a masking blade 10 serving as a light-shielding member. Note that the present invention is also applicable to an exposure apparatus of the step and repeat scheme.

FIG. 1 adopts an X-Y-Z coordinate system in which a direction parallel to the scanning direction of a substrate stage 15 and an original stage 12 is defined as the Y direction, and a direction perpendicular to the Y direction is defined as the X direction.

An exposure apparatus EX shown in FIG. 1 includes a controller CNT, which controls the operation of each component of the exposure apparatus EX. In this embodiment, the controller CNT includes an exposure controller 26 that performs control associated with the exposure, and a stage controller 25 that performs control associated with the substrate stage 15 and the original stage 12.

The illumination system IL can include components 1 to 10. A light source unit 1 emits light to expose the substrate 14. The light source unit 1 can be a pulsed laser light source, such as an ArF excimer laser or a KrF excimer laser, but is not limited to them. The light source unit 1 can be configured to be able to change, for example, the light intensity and the pulse oscillation period. The controlled variables, e.g., the light intensity and pulse oscillation can be adjusted in accordance with exposure dose control by the exposure controller 26, and synchronous control of the substrate stage 15 and the original stage 12 by the stage controller 25.

Exposure light emitted by the light source unit 1 is guided to a chamber of the exposure apparatus by an extension optical system 2. After that, the light intensity of the exposure light can be adjusted by an energy-light-attenuating unit 3. The energy-light-attenuating unit 3 includes a turret on which a plurality of neutral density (ND) filters having different transmittances are arranged. The light intensity is adjusted by selecting an appropriate ND filter by rotating the turret. The light intensity may be finely adjusted by connecting a plurality of turrets in series with each other.

The exposure light having passed through the energy-light-attenuating unit 3 enters a beam shaping optical system 4. The beam shaping optical system 4 includes, for example, a plurality of meniscus lenses and cylindrical lenses, and shapes the section of the exposure light (beam) to make its illuminance uniform. The light having passed through the beam shaping optical system 4 is shaped by a light source shape forming unit 5 to form a light source having a targeted angle distribution (effective light source). The light source shape forming unit 5 is configured by, for example, arranging a turret including a plurality of aperture stops attached in series with that including a plurality of zoom lenses attached. A light source having a targeted angle distribution is formed by controlling the rotation angle of each turret.

The optical path of the exposure light having passed through the light source shape forming unit 5 is changed by a reflecting mirror 6. After that, the exposure light is shaped into slit-like exposure light having a uniform illuminance distribution by a uniform distribution forming unit 7. The uniform distribution forming unit 7 can include, for example, a convex lens and a fly-eye lens including a plurality of microlenses arrayed in a lattice pattern. The exposure light having passed through each microlens of the fly-eye lens is diverged to a wide angle, and the diverged exposure light is guided to the slit opening as a multibeam by the convex lens, thereby forming a slit-like, uniform illuminance distribution.

The slit-like exposure light is split at a light intensity ratio of for example, 1: one several-millionth in the directions of the substrate 14 and an integrating sensor 9 by a beam splitter 8. The integrating sensor 9 is used to integrate the dose of incident exposure light on it and to indirectly detect the integrated dose of exposure light that strikes the substrate 14. The output from the integrating sensor 9 can be sent to the exposure controller 26, and the intensity of light emitted by the light source unit 1 and the transmittance of the energy-light-attenuating unit 3 can be controlled based on the sent information. The output from the integrating sensor 9 may also be sent to the stage controller 25, and synchronous control of the original stage 12 and the substrate stage 15 may be adjusted based on the sent information. The exposure dose in each shot region on the substrate 14 can be kept constant by controlling the driving of the original stage 12 and the substrate stage 15 in accordance with the exposure dose.

The light having passed through the beam splitter 8 is shielded by the masking blade (light-shielding member) 10. With this operation, the illumination region (the region where the light on the plane on which the original 11 is set (i.e., the object plane of the projection optical system 13), enters, illuminated by the illumination system IL, is defined. With this operation, the exposure region (the region where the light on the image plane of the projection optical system 13 enters) on the plane on which the substrate 14 is set, i.e., the image plane of the projection optical system 13 is, in turn, defined. The masking blade 10 can include a plurality of blades. In one example, the masking blade 10 can include a total of four blades: two blades 10XL and 10XR, which face each other and are driven in the X direction, and two blades 10YU and 10YD, which face each other and are driven in the Y direction (scanning direction).

During the exposure of the substrate 14, the stage controller 25 controls the blades 10XL and 10XR in the X direction to have a required opening size in order to prevent the light from entering the region outside the exposure target shot region. Also, the stage controller 25 moves the blades 10YU and 10YD by synchronously driving the original stage 12 and the substrate stage 15.

The exposure light having passed through the opening defined by the masking blade 10 strikes the original 11 held by the original stage 12. A pattern to manufacture a device is formed on the original 11. The position of the original stage 12 is measured by a laser interferometer. The position information of the original stage 12 measured by the laser interferometer is sent to the stage controller 25. The stage controller 25 determines the position and velocity of the original stage 12 to synchronize the original stage 12 with the substrate stage 15, based on the position information of the original stage 12, and controls the original stage 12.

By the exposure light that strikes the original 11, the pattern of the original 11 is reduced and projected onto the substrate 14 via the projection optical system 13. The position of the substrate stage 15 is measured by a laser interferometer. The position information of the substrate stage 15 measured by the laser interferometer is sent to the stage controller 25. The stage controller 25 determines the position and velocity of the substrate stage 15 to synchronize the substrate stage 15 with the original stage 12, based on the position information of the substrate stage 15, and controls the substrate stage 15.

The substrate stage 15 mounts a measurement device 16. The measurement device 16 measures the illuminance and illuminance distribution of the exposure light that falls on the plane on which the substrate 14 is set, i.e., the image plane of the projection optical system 13. The measurement device 16 can include a light-shielding plate having pinholes formed, and a photoelectric conversion device that detects the light having passed through the pinhole. The area information of the pinhole is stored in a storage unit 27 and used to calculate the illuminance based on the output from the measurement device 16.

In measuring the illuminance of the exposure light that falls on the image plane of the projection optical system 13, the substrate stage 15 is driven so that the measurement device 16 is set near a target measurement position, and the illumination system IL is controlled so that the exposure light enters the measurement device 16. In measuring the illuminance distribution of the exposure light that falls on the image plane of the projection optical system 13, the measurement device 16 performs the measurement while the substrate stage 15 is moved (e.g., moved step by step at a predetermined step width). An illuminance distribution can be obtained based on a plurality of positions of the substrate stage 15 (i.e., a plurality of positions of the measurement device 16) and a plurality of measurement results obtained by the measurement device 16 in correspondence with these positions.

The photoelectric conversion device of the measurement device 16 is not limited to a single photoelectric conversion device, and a line sensor or an image sensor including a plurality of photoelectric conversion devices may be used instead. The effective light source shape can be measured using a measurement device including a plurality of photoelectric conversion devices for each pinhole to measure the incident light at a position defocused from the image plane of the projection optical system 13.

The exposure controller 26 calculates the illuminance based on the output from the measurement device 16, and controls the light source unit 1 and the energy-light-attenuating unit 3 based on the calculated illuminance. The output from the measurement device 16 is also used as a reference to calibrate the integrating sensor 9.

In illuminance measurement for calibrating the measurement device 16, an illuminance sensor 18 having a pinhole 17 is used. The illuminance sensor 18 serves to measure the illuminance on the image plane of the projection optical system 13, and is connected to a circuit portion 19 via a cable. The circuit portion 19 may be, for example, arranged outside the exposure apparatus, mounted on a hand 21 that holds the illuminance sensor 18, or arranged on another member. The output from the illuminance sensor 18 is converted into illuminance information upon being arithmetically processed by the circuit portion 19. The obtained illuminance can be displayed on a display provided to the circuit portion 19. The circuit portion 19 can be connected to the controller CNT, and the illuminance information obtained upon arithmetic processing by the circuit portion 19 can be transmitted to the controller CNT. Alternatively, the operator may read the illuminance displayed on the display, and input the read illuminance to the controller CNT via an input device (not shown).

The hand 21 can include a holding unit 22 for holding the illuminance sensor 18, and a position sensor 23 for measuring the position in the Z direction (a direction parallel to the optical axis of the projection optical system 13). The position sensor 23 can be a displacement gauge of, for example, the eddy current scheme, the capacitance scheme, or the laser scheme.

The projection optical system 13 can be surrounded by a lens barrel 24 made of, for example, stainless steel excellent in corrosion resistance. The positional relationship between the lower surfaces of the projection optical system 13 and lens barrel 24 in the Z direction is maintained precisely. For this reason, the coordinate of the illuminance sensor 18 in the Z direction can be detected by measuring the relative position between the position sensor 23 and the lower surface of the lens barrel 24 in the Z direction. When a displacement gauge of the capacitance scheme is used as the position sensor 23, it can measure the displacement amount regardless of whether the measurement target is made of metal or is a nonmetal. For this reason, the position sensor 23 may perform the measurement with reference to the lower surface of the projection optical system 13 in this case.

The hand 21 that holds the illuminance sensor 18 is driven by a driving mechanism 20, including an actuator, which can drive the hand 21 in the X, Y, and Z directions, and can automatically load the illuminance sensor 18 to the measurement position. Although the driving mechanism 20 drives the illuminance sensor 18 by driving the hand 21 herein, a driving mechanism that moves the illuminance sensor 18 relative to the hand 21 may be provided.

To measure the illuminance using the illuminance sensor 18, the illuminance sensor 18 is driven by the driving mechanism 20 and set near a target measurement position (Xc, Yc) on the image plane of the projection optical system 13. At this time, the driving mechanism 20 precisely adjusts the position of the illuminance sensor 18 in the Z direction based on the output from the position sensor 23. The reason why the expression "near a target measurement position" is used herein is that, at this moment, the precise position (X- and Y-coordinates) of the illuminance sensor 18 on the image plane of the projection optical system 13 is unknown, so the illuminance sensor 18 is not precisely positioned at the target position.

Figure 2:
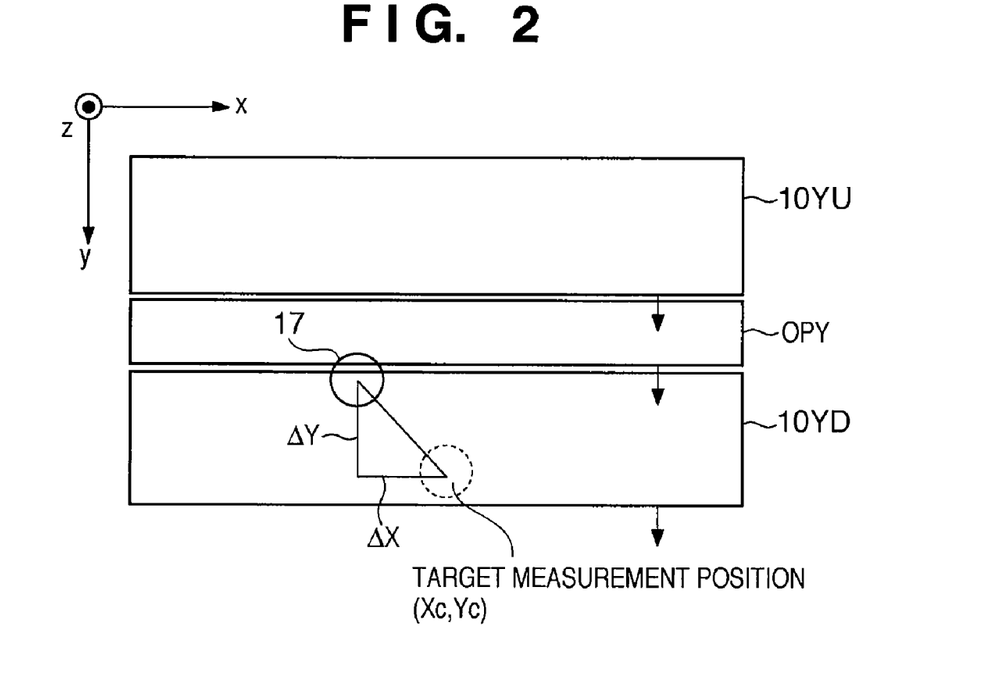
FIG. 2 is a diagram showing the positional relationship between a masking blade and a pinhole in an illuminance sensor.

After the illuminance sensor 18 is set near the target measurement position by the driving mechanism 20, the masking blade 10 is driven to limit the illumination region illuminated by the illumination system IL. With this operation, the exposure region on the image plane of the projection optical system 13 is, in turn, limited. FIG. 2 is a diagram showing the positional relationship between the masking blade 10, and, more specifically, the blades 10YU and 10YD, and the pinhole 17 in the illuminance sensor 18. An opening OPY is defined by the blades 10YU and 10YD, which face each other with a spacing between them, and the illumination region and the exposure region are, in turn, defined. To detect the position of the illuminance sensor 18 in the Y direction, the stage controller 25 in the controller CNT moves the blades 10YU and 10YD in the Y direction while the positions of the blades 10XL and 10XR are fixed. The blades 10YU and 10YD may be moved step by step at a predetermined step width or moved continuously.

In FIG. 2, reference symbols ΔX and ΔY denote the amounts of deviation in the X and Y directions, respectively, between the target measurement position (Xc, Yc) and the actual position of the pinhole 17. A process of detecting the position of the illuminance sensor 18 in the Y direction (to be referred to as a Y-direction position detection process hereafter) will be explained first. The exposure region moves in the Y direction on the image plane of the projection optical system 13 by moving the blades 10YU and 10YD (by, e.g., step-by-step movement or continuous movement), while the positions of the blades 10XL and 10XR are fixed. Based on the output from the illuminance sensor 18 at this time, the controller CNT detects a position Y0 of the illuminance sensor 18 in the Y direction on the image plane of the projection optical system 13.

Figure 3:
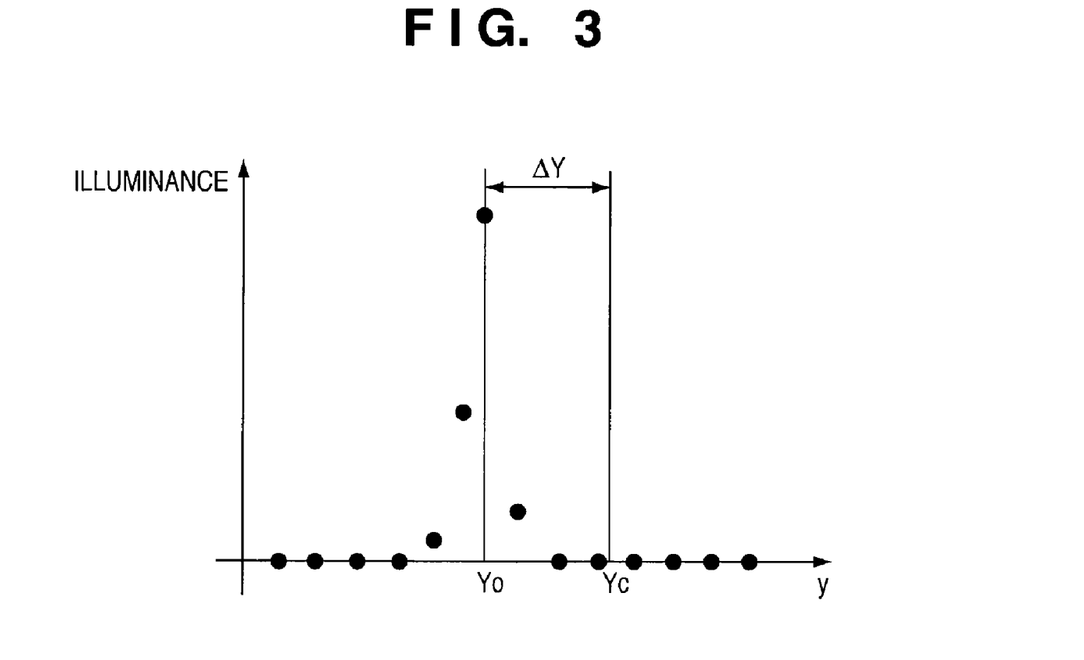
FIG. 3 is a graph illustrating the result obtained by a Y-direction position detection process.

FIG. 3 is a graph illustrating the result obtained by the Y-direction position detection process. Referring to FIG. 3, the abscissa indicates the position of the opening OPY formed by the blades 10YU and 10YD, of the masking blade 10, which can be driven in the Y direction, and the ordinate indicates the illuminance measured using the illuminance sensor 18. That is, FIG. 3 shows a change in illuminance in response to a change in the position of the opening OPY. The controller CNT detects the peak value of the change in illuminance, and detects a position Y0 of the illuminance sensor 18 in the Y direction based on the position, of the opening OPY, at which the detected peak is obtained. Instead of the peak value of the change in illuminance, the barycentric position in the change in illuminance, for example, may be calculated, and the position of the illuminance sensor 18 may be determined based on the barycentric position.

Figure 4:
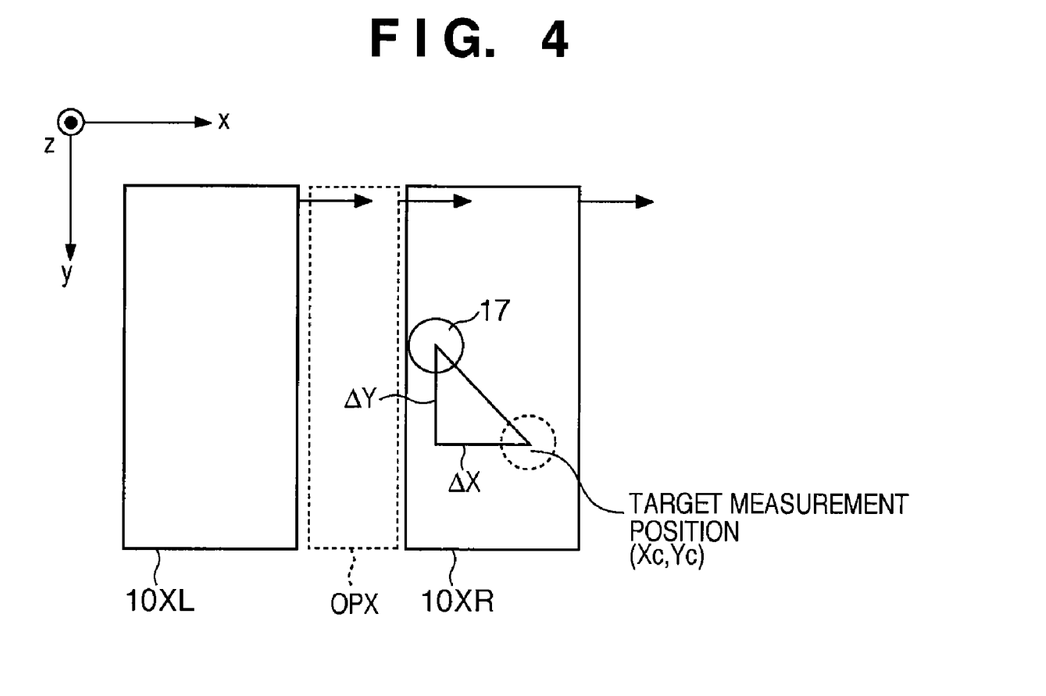
FIG. 4 is a diagram showing the positional relationship between the masking blade and the pinhole in the illuminance sensor.

A process of detecting the position of the illuminance sensor 18 in the X direction (to be referred to as an X-direction position detection process hereafter) will be explained next. The X-direction position detection process is the same as the Y-direction position detection process, except that the direction of interest differs between them. FIG. 4 is a diagram showing the positional relationship between the masking blade 10, and, more specifically, the blades 10XL and 10XR, and the pinhole 17 in the illuminance sensor 18. An opening OPX is defined by the blades 10XL and 10XR, which face each other with a spacing between them, and the illumination region and the exposure region are, in turn, defined. To detect the position of the illuminance sensor 18 in the X direction, the stage controller 25 in the controller CNT moves the blades 10XL and 10XR in the X direction, while the positions of the blades 10YU and 10YD are fixed. The blades 10XL and 10XR may be moved step by step at a predetermined step width or moved continuously.

Figure 5:
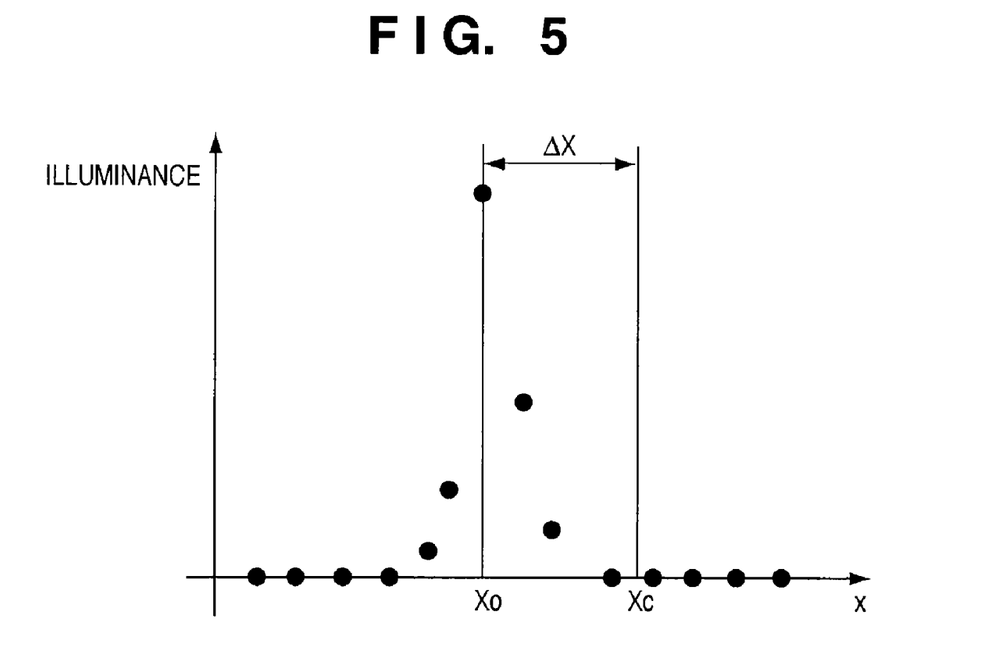
FIG. 5 is a graph illustrating the result obtained by an X-direction position detection process.

FIG. 5 is a graph illustrating the result obtained by the X-direction position detection process. Referring to FIG. 5, the abscissa indicates the position of the opening OPX formed by the blades 10XL and 10XR, of the masking blade 10, which can be driven in the X direction, and the ordinate indicates the illuminance measured using the illuminance sensor 18. That is, FIG. 5 shows a change in illuminance in response to a change in the position of the opening OPX. The controller CNT detects the peak value of the change in illuminance, and detects a position X0 of the illuminance sensor 18 in the X direction based on the position, of the opening OPX, at which the detected peak is obtained. Instead of the peak value of the change in illuminance, the barycentric position in the change in illuminance, for example, may be calculated, and the position of the illuminance sensor 18 may be determined based on the barycentric position.

With the foregoing processes, an actual position $(X_0, Y_0)$ of the illuminance sensor 18 on the image plane of the projection optical system 13 is detected. Either the X- or Y-direction position detection process may be performed first. The controller CNT calculates a deviation $(\Delta X, \Delta Y)$ of the actual position $(X_0, Y_0)$ of the illuminance sensor 18 with respect to the target measurement position (Xc, Yc) based on the actual position $(X_0, Y_0)$. Based on the deviation $(\Delta X, \Delta Y)$, the controller CNT operates the driving mechanism 20 so that the position of the illuminance sensor 18 matches the target measurement position (Xc, Yc). With this operation, the illuminance sensor 18 is positioned at the target measurement position (Xc, Yc).

The exposure apparatus EX must include the masking blade 10 serving as a light-shielding member in order to define the illumination region illuminated by the illumination system IL, and this makes the positioning accuracy of the exposure apparatus EX high enough to detect the position of the illuminance sensor 18. Detecting the position of the illuminance sensor 18 by exploiting such a masking blade 10 makes it possible to position the illuminance sensor 18 in the main region, in which the light intensity is uniform, of the exposure region, without providing an additional position measurement device.

After the position adjustment of the illuminance sensor 18, the controller CNT adjusts the position of the masking blade 10 so that the pinhole 17 in the illuminance sensor 18 falls within the main region of the exposure region. Next, the controller CNT controls the illumination system IL so that the light falls on the image plane of the projection optical system 13. In this state, the controller CNT measures the illuminance on the image plane of the projection optical system 13 using the illuminance sensor 18. The controller CNT stores the illuminance measurement result in the storage unit 27. After that, the illuminance sensor 18 is retracted from the image plane of the projection optical system 13. Instead, the measurement device 16 mounted on the substrate stage 15 is set at the target measurement position and measures the illuminance.

At the times of the measurements of the illuminances by the illuminance sensor 18 and the measurement device 16, the illuminances on the image plane of the projection optical system 13 at these times are preferably as equal as possible. To attain this state, the exposure controller 26 preferably controls the light source unit 1 and the energy-light-attenuating unit 3, so that the outputs from the integrating sensor 9 at the times of these two measurements match a common target value.

Figure 6:
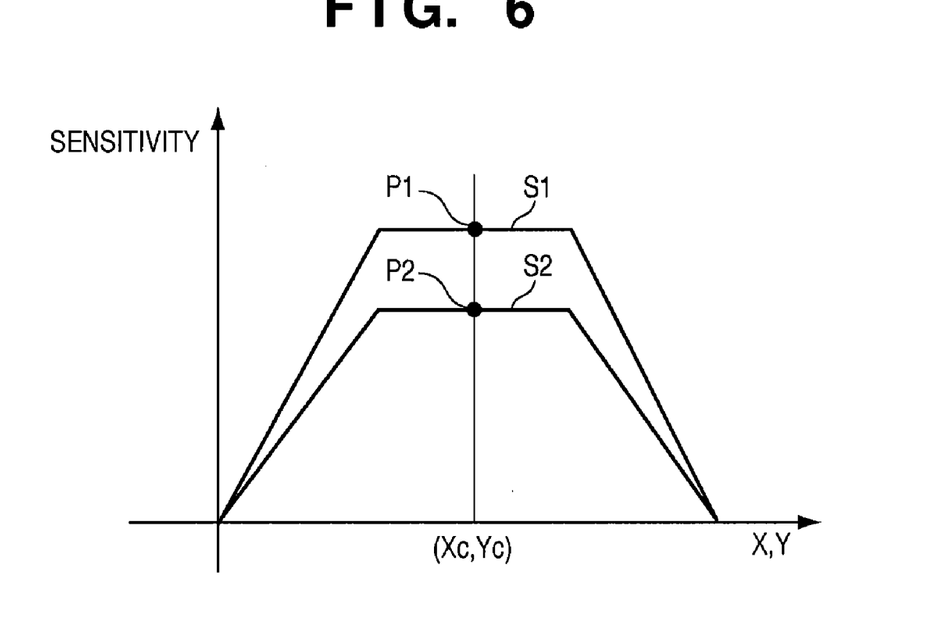
FIG. 6 is a graph illustrating the sensitivity characteristics of the illuminance sensor and a measurement device with respect to a trapezoidal illuminance distribution formed on the image plane of a projection optical system to expose a substrate.

FIG. 6 is a graph illustrating sensitivity characteristics S1 and S2 of the illuminance sensor 18 and measurement device 16, respectively, with respect to a trapezoidal illuminance distribution formed on the image plane of the projection optical system 13 to expose a substrate. Referring to FIG. 6, the abscissa indicates the positions of the illuminance sensor 18 and measurement device 16 in the X and Y directions, and the ordinate indicates the sensitivities of the illuminance sensor 18 and measurement device 16 with respect to the illuminance distribution. The measurement position at the center of the optical axis is defined as (Xc, Yc), and the sensitivities of the illuminance sensor 18 and measurement device 16 at the measurement position (Xc, Yc) are defined as P1 and P2, respectively. The controller CNT calculates a calibration value for the measurement device 16 by $(P2/P1)^{-1}$, stores the calibration value in the storage unit 27, and corrects the sensitivity of the measurement device 16 in accordance with the calibration value thereafter.

As described above, the process by the controller CNT associated with the measurement of the measurement device 16 can include the following processes. First, the controller CNT acquires a first measurement value by causing the illuminance sensor 18 to measure the illuminance, while the illuminance sensor 18 and the masking blade 10 are set at the target measurement position and the substrate exposure position, respectively. Second, the controller CNT acquires a second measurement value as the result of measuring the illuminance by the measurement device 16, while the measurement device 16 and the masking blade 10 are set at the target measurement position and the substrate exposure position, respectively. Lastly, the controller CNT determines a calibration value to calibrate the measurement device 16 based on the first measurement value and the second measurement value.

Second Embodiment

The second embodiment of the present invention will be explained below. Note that details which are not particularly referred to in the second embodiment can be the same as those in the first embodiment. In the second embodiment, a measurement device 16 is calibrated based on the position detection result obtained by an illuminance sensor 18, and the illuminance distribution on the image plane of a projection optical system 13 measured using the measurement device 16 while a masking blade 10 is set at the substrate exposure position.

More specifically, first, a controller CNT detects the position of the illuminance sensor 18 in accordance with the first embodiment. Next, the controller CNT acquires a first measurement value by causing the illuminance sensor 18 to measure the illuminance while the position of the illuminance sensor 18 remains the same as that during the position detection of the illuminance sensor 18, and the masking blade 10 is set at the substrate exposure position. Also, the controller CNT acquires a second measurement value as the measurement result obtained by the measurement device 16, while the measurement device 16 is set at the same position as that of the illuminance sensor 18 during the position detection of the illuminance sensor 18, and the masking blade 10 is positioned at the substrate exposure position. At this time, the controller CNT can acquire a second measurement value based on the illuminance distribution measured in advance by the measurement device 16. Lastly, the controller CNT determines a calibration value to calibrate the measurement device 16 based on the first measurement value and the second measurement value.

In the second embodiment, a calibration value to calibrate the measurement device 16 can be determined without finely adjusting the position of the illuminance sensor 18 after the position of the illuminance sensor 18 is detected. This makes it possible to shorten the time taken to calibrate the measurement device 16. In addition, there is no need to move the measurement device 16 in its calibration, as long as the illuminance distribution on the image plane of the projection optical system 13 is obtained in advance using the measurement device 16.

A more detailed example of the calibration procedure according to the second embodiment will be explained. First, the controller CNT controls a driving mechanism 20 to set the illuminance sensor 18 near a target measurement position (Xc, Yc) on the image plane of the projection optical system 13, as in the first embodiment. At this time, the driving mechanism 20 precisely adjusts the position of the illuminance sensor 18 in the Z direction based on the output from a displacement gauge (position sensor) 23. Next, the controller CNT detects an actual position (X0, Y0) of the illuminance sensor 18 using the masking blade 10, as in the first embodiment. The second embodiment is different from the first embodiment in that it omits an operation for finely adjusting the position of the illuminance sensor 18, so that the position of the illuminance sensor 18 matches the target measurement position (Xc, Yc), after the position of the illuminance sensor 18 is detected.

Figure 7:
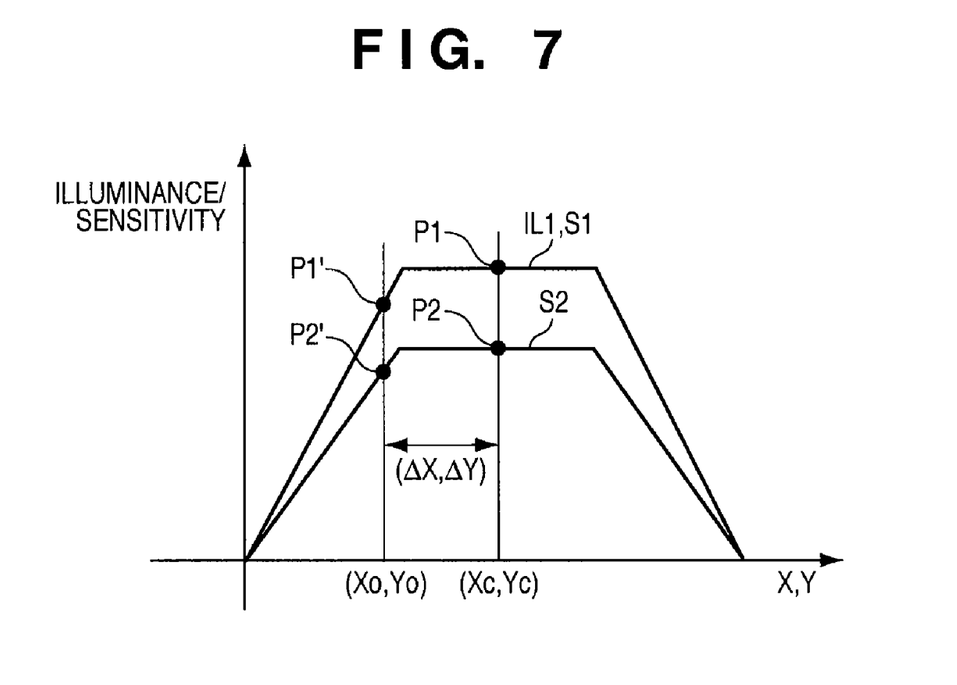
FIG. 7 is a graph illustrating the sensitivity characteristic of a measurement device and a trapezoidal illuminance distribution formed on the image plane of a projection optical system to expose a substrate.

FIG. 7 is a graph illustrating a sensitivity characteristic S2 of the measurement device 16 and a trapezoidal illuminance distribution IL1 formed on the image plane of the projection optical system 13 to expose a substrate. Referring to FIG. 7, the abscissa indicates the positions of the illuminance sensor 18 and measurement device 16 in the X and Y directions, and the ordinate indicates the trapezoidal illuminance distribution IL1 and the sensitivity of the measurement device 16 with respect to it. Note that a sensitivity characteristic S1 of the illuminance sensor 18 is equivalent to the illuminance distribution IL1 (i.e., the illuminance sensor 18 has no error).

The position $(X_0, Y_0)$ of the illuminance sensor 18 deviates from the target measurement position (Xc, Yc) due to a driving error ($\Delta X, \Delta Y$). For this reason, the illuminance measured using the illuminance sensor 18, while the masking blade 10 is set at the substrate exposure position, without changing the position of the illuminance sensor 18, may be that in the peripheral region, in which a lower illuminance is obtained at a position closer to the periphery, of the exposure region. In view of this, to calibrate the measurement device 16 without changing the position $(X_0, Y_0)$ of the illuminance sensor 18 to the target measurement position (Xc, Yc), the measurement result obtained by the measurement device 16 while it is set at the position $(X_0, Y_0)$ is used in the second embodiment.

Note that, before the sensitivity of the measurement device 16 is calibrated, the sensitivity characteristic S2 of the measurement device 16 can be measured in advance in, for example, inspecting the illuminance distribution on the image plane of the projection optical system 13, and stored in a storage unit 27. The controller CNT reads out the information of the sensitivity characteristic S2 (illuminance distribution) from the storage unit 27, and acquires an illuminance P2' of the measurement device 16 at the position $(X_0, Y_0)$ of the illuminance sensor 18 based on the sensitivity characteristic S2. Needless to say, if the sensitivity characteristic S2 is not stored in the storage unit 27 in advance, it may be acquired by measurement.

The controller CNT moves the masking blade 10 to the substrate exposure position, while the illuminance sensor 18 is set at the position $(X_0, Y_0)$, and measures the illuminance using the illuminance sensor 18. The measured illuminance is an illuminance P1'.

The controller CNT calculates a calibration value for the measurement device 16 by $(P2'/P1')^{-1}$, stores the calibration value in the storage unit 27, and corrects the sensitivity of the measurement device 16 in accordance with the calibration value thereafter.

Device Manufacturing Method

A device manufacturing method according to a preferred embodiment of the present invention is suitable for manufacturing, for example, a semiconductor device and a liquid crystal device. This method can include a step of transferring the pattern of an original onto a photoresist applied on a substrate using the above-mentioned exposure apparatus, and a step of developing the photoresist. The devices are manufactured by further other known steps (e.g., etching, resist removal, dicing, bonding, and packaging).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

What is claimed is:

1. An exposure apparatus which projects a pattern of an original illuminated by an illumination system onto a substrate, by a projection optical system, to expose the substrate, the apparatus comprising:
   a light-shielding member configured to define a position at which light falls on an image plane of the projection optical system;
   an illuminance sensor configured to measure an illuminance on the image plane and to produce an output; and
   a controller configured to detect a position, on the image plane, of the illuminance sensor, wherein the controller is configured to detect the position of the illuminance sensor based on a peak of the output from the illuminance sensor and a position of the light shielding member obtained while moving the light-shielding member, so that a position at which light falls on the image plane moves along the image plane.

2. The apparatus according to claim 1, further comprising a measurement device which is mounted on a substrate stage that holds a substrate, and which is configured to measure an illuminance on the image plane, wherein the measurement device is calibrated using the illuminance sensor.

3. The apparatus according to claim 2, wherein the controller is configured to execute:
   (i) a process of acquiring a first measurement value by causing the illuminance sensor to perform the measurement while the position of the illuminance sensor remains the same as that during the position detection of the illuminance sensor and the light-shielding member is set at a substrate exposure position;
   (ii) a process of acquiring a second measurement value as the measurement result obtained by the measurement device while the measurement device is set at the same position as the position of the illuminance sensor during the position detection of the illuminance sensor and the light-shielding member is positioned at the substrate exposure position; and
   (iii) a process of determining a calibration value to calibrate the output from the measurement device based on the first measurement value and the second measurement value.

4. An exposure apparatus which projects a pattern of an original illuminated by an illumination system onto a substrate, by a projection optical system, to expose the substrate, the apparatus comprising:
   a light-shielding member configured to define a position at which light falls on an image plane of the projection optical system;
   an illuminance sensor configured to measure an illuminance on the image plane and to produce an output;
   a controller configured to detect a position, on the image plane, of the illuminance sensor, wherein the controller is configured to detect the position of the illuminance sensor based on the output from the illuminance sensor obtained while moving the light-shielding member, so that a position at which light falls on the image plane moves along the image plane; and
   a measurement device which is mounted on a substrate stage that holds a substrate, and which is configured to measure an illuminance on the image plane, wherein the measurement device is calibrated using the illuminance sensor,
   wherein, based on the detection result of the position of the illuminance sensor, the controller controls a driving mechanism, which positions the illuminance sensor, so that the position of the illuminance sensor matches a target measurement position.

5. The apparatus according to claim 4, wherein the controller is configured to execute:
   (i) a process of acquiring a first measurement value by causing the illuminance sensor to perform the measurement while the illuminance sensor is set at the target measurement position and the light-shielding member is set at a substrate exposure position;
   (ii) a process of acquiring a second measurement value as the measurement result obtained by the measurement device while the measurement device is set at the target measurement position and the light-shielding member is set at the substrate exposure position; and
   (iii) a process of determining a calibration value to calibrate the measurement device based on the first measurement value and the second measurement value.

6. A device manufacturing method comprising the steps of:
   (a) exposing a substrate using an exposure apparatus configured to project a pattern of an original illuminated by an illumination system onto the substrate, by a projection optical system, to expose the substrate; and
   (b) developing the substrate,
   wherein the exposure apparatus comprises:
   (i) a light-shielding member configured to define a position at which light falls on an image plane of the projection optical system;
   (ii) an illuminance sensor configured to measure an illuminance on the image plane and to produce an output; and
   (iii) a controller configured to detect a position, on the image plane, of the illuminance sensor, wherein the controller is configured to detect the position of the illuminance sensor based on a peak of the output from the illuminance sensor and a position of the light shielding member obtained while moving the light-shielding member, so that a position at which light falls on the image plane moves along the image plane.

* * * * *